US011619376B2

(12) United States Patent
Veenstra et al.

(10) Patent No.: US 11,619,376 B2
(45) Date of Patent: Apr. 4, 2023

(54) ILLUMINATION ASSEMBLY INCLUDING THERMAL ENERGY MANAGEMENT

(71) Applicant: Innotec, Corp., Zeeland, MI (US)

(72) Inventors: Thomas J. Veenstra, Lakewood, CO (US); Russell Alan Malek, Holland, MI (US)

(73) Assignee: Innotec, Corp., Zeeland, MI (US)

( * ) Notice: Subject to any disclaimer, the term of this patent is extended or adjusted under 35 U.S.C. 154(b) by 0 days.

(21) Appl. No.: 17/669,727

(22) Filed: Feb. 11, 2022

(65) Prior Publication Data

US 2022/0170622 A1    Jun. 2, 2022

Related U.S. Application Data

(63) Continuation of application No. 15/178,869, filed on Jun. 10, 2016, now abandoned.

(51) Int. Cl.
| | |
|---|---|
| F21V 29/70 | (2015.01) |
| F21V 29/503 | (2015.01) |
| H05K 1/02 | (2006.01) |
| F21K 9/90 | (2016.01) |
| F21V 23/00 | (2015.01) |
| F21Y 107/00 | (2016.01) |
| F21Y 115/10 | (2016.01) |

(52) U.S. Cl.
CPC ............... *F21V 29/70* (2015.01); *F21K 9/90* (2013.01); *F21V 23/00* (2013.01); *F21V 29/503* (2015.01); *H05K 1/0203* (2013.01); *F21Y 2107/00* (2016.08); *F21Y 2115/10* (2016.08); *H05K 1/0204* (2013.01); *H05K 2201/0129* (2013.01); *H05K 2201/09118* (2013.01); *H05K 2201/10106* (2013.01); *H05K 2201/10416* (2013.01)

(58) Field of Classification Search
CPC ...... F21V 29/70; F21V 29/004; F21V 23/005; F21V 23/00; F21V 23/06; F21V 23/80; F21K 9/90; F21K 9/00
See application file for complete search history.

(56) References Cited

U.S. PATENT DOCUMENTS

| | | | |
|---|---|---|---|
| 5,857,767 | A | 1/1999 | Hochstein |
| 5,965,843 | A | 10/1999 | Schonberger et al. |
| 6,180,045 | B1 | 1/2001 | Brandenburg et al. |
| 6,426,143 | B1 | 7/2002 | Voss et al. |

(Continued)

FOREIGN PATENT DOCUMENTS

| | | |
|---|---|---|
| DE | 3424387 | 1/1986 |
| JP | 2002094122 | 3/2002 |
| WO | 2008024761 | 2/2008 |

OTHER PUBLICATIONS

International Search Report and Written Opinion from PCT/US2017/033764 dated Aug. 3, 2017.

*Primary Examiner* — Arman B Fallahkhair
(74) *Attorney, Agent, or Firm* — Warner Norcross + Judd LLP

(57) ABSTRACT

An illumination assembly includes a polymeric substrate, an electrical circuit including two conductors supported by the polymeric substrate, an LED electrically coupled to the two conductors, and a heat spreader thermally coupled to the LED. The two conductors can be printed on the polymeric substrate, embedded within the polymeric substrate, or lie atop the polymeric substrate. The illumination assembly may be fabricated in three-dimensional form factors.

4 Claims, 9 Drawing Sheets

(56) References Cited

U.S. PATENT DOCUMENTS

| | | | |
|---|---|---|---|
| 6,874,910 B2 | 4/2005 | Sugimoto et al. | |
| 7,354,794 B2 | 4/2008 | Anderson et al. | |
| 7,632,717 B2 | 12/2009 | Crispell et al. | |
| 7,795,051 B2 * | 9/2010 | Elpedes | H01L 33/642 438/26 |
| 7,808,097 B2 | 10/2010 | Wang et al. | |
| 7,909,482 B2 | 3/2011 | Veenstra et al. | |
| 7,993,031 B2 | 8/2011 | Grajcar | |
| 8,071,998 B2 * | 12/2011 | Chen | F21V 29/505 257/98 |
| 8,138,422 B2 | 3/2012 | Park et al. | |
| 8,309,855 B2 * | 11/2012 | Chung | H05K 1/0274 174/254 |
| 8,371,723 B2 * | 2/2013 | Nall | F21S 4/10 362/249.02 |
| 8,465,175 B2 | 6/2013 | Nall et al. | |
| 8,502,262 B2 | 8/2013 | Preuschl et al. | |
| 8,514,545 B2 | 8/2013 | Haag | |
| 8,555,493 B2 | 10/2013 | Xu et al. | |
| 8,562,177 B2 * | 10/2013 | Kajiya | H05K 1/189 362/249.04 |
| 8,593,760 B2 | 11/2013 | McGuire, Jr. | |
| 8,661,660 B2 * | 3/2014 | Ter-Hovhannissian | F21V 29/74 29/846 |
| 8,764,240 B2 | 7/2014 | Veenstra et al. | |
| 9,076,949 B2 | 7/2015 | Kim et al. | |
| 9,175,842 B2 * | 11/2015 | Jokelainen | F21V 29/85 |
| 9,179,543 B2 | 11/2015 | Palaniswamy et al. | |
| 9,297,675 B2 | 3/2016 | Keranen et al. | |
| 2004/0135156 A1 | 7/2004 | Takenaka | |
| 2008/0202912 A1 | 8/2008 | Boddie et al. | |
| 2008/0288036 A1 | 11/2008 | Greenberg et al. | |
| 2011/0186873 A1 | 8/2011 | Emerson | |
| 2012/0055702 A1 | 3/2012 | Rathburn | |
| 2013/0201620 A1 | 8/2013 | Schlaupitz et al. | |
| 2013/0228363 A1 | 9/2013 | Hattori et al. | |
| 2013/0248345 A1 | 9/2013 | Hagg et al. | |
| 2013/0314910 A1 | 11/2013 | Huang et al. | |
| 2013/0330533 A1 | 12/2013 | Amey et al. | |
| 2014/0002996 A1 | 1/2014 | Malek et al. | |
| 2014/0011395 A1 | 1/2014 | Xu et al. | |
| 2014/0167095 A1 | 6/2014 | Kim et al. | |

* cited by examiner

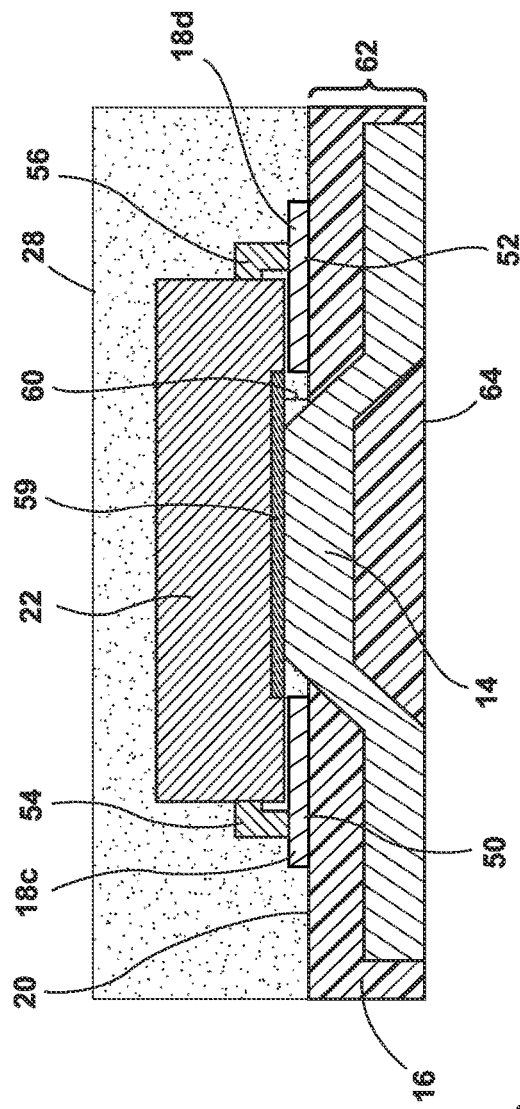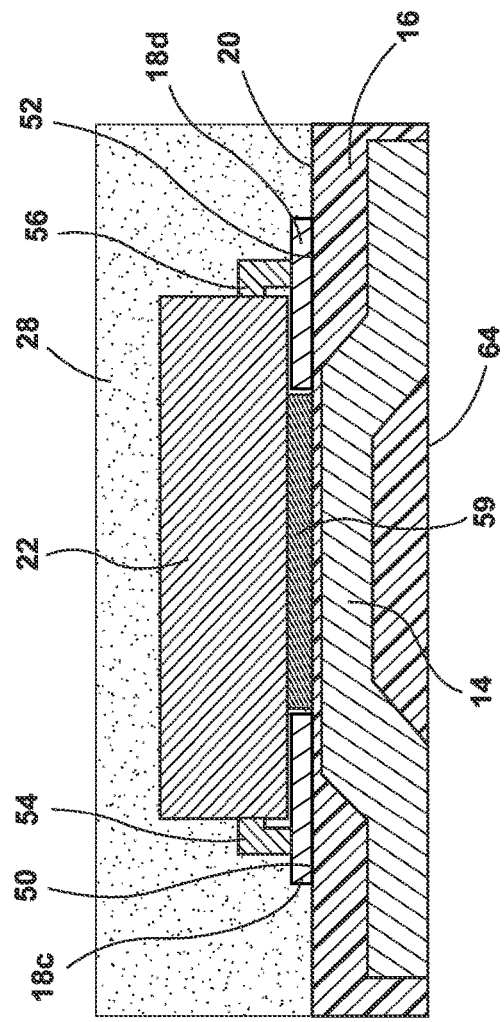
FIG. 2
FIG. 3

ILLUMINATION ASSEMBLY INCLUDING THERMAL ENERGY MANAGEMENT

BACKGROUND OF THE INVENTION

The present invention relates to illumination assemblies, and more particularly to illumination assemblies that provide thermal energy management.

Solid-state lighting, such as those utilizing light emitting diodes (LEDs), has been adopted for widespread applications. However, solid-state lighting design involves a balance of thermal, mechanical, optical, and electrical considerations. In particular, thermal considerations dictate the practical limits of many designs.

In solid-state lighting, electronics are assembled on a printed circuit board, which allows component design only in two dimensions. This limitation is generally acceptable where there is a high demand for densely populated components and low demand for populating those components throughout a three-dimensional form factor. In contrast, in LED applications, the demand for high component density is lower, but the need to accommodate complex and three-dimensional form factors is higher. Unfortunately, existing technologies do not permit three-dimensional form factors in desired balances with other considerations.

SUMMARY OF THE INVENTION

The aforementioned problems are overcome in the present invention in which an illumination assembly includes a polymeric substrate and a heat spreader supported by the substrate to provide electrical current and thermal energy management to solid-state lighting applications using LEDs.

According to one embodiment, an illumination assembly includes a first polymeric substrate, an electrical circuit including two conductors supported by the first polymeric substrate, an LED electrically coupled to the two conductors, and a heat spreader supported by the substrate and thermally coupled to the LED.

In another embodiment, an illumination assembly includes a first polymeric substrate, an electrical circuit including a first pair of conductors embedded within the first polymeric substrate and a second pair of conductors printed on the first polymeric substrate, an LED electrically coupled to the second pair of conductors, and a heat spreader supported by the substrate and thermally coupled to the LED.

In yet another embodiment, a method of forming an illumination assembly comprises: (1) forming a polymeric substrate having opposing first and second sides, (2) forming an electrical circuit including two conductors supported on the first side of the polymeric substrate, (3) electrically coupling an LED with the two conductors, (4) thermally coupling a heat spreader with the LED, the heat spreader at least primarily disposed on the second side of the polymeric substrate, and (5) over-molding a first polymeric layer over at least portions of the LED, the two conductors, and the polymeric substrate.

These and other advantages and features of the invention will be more fully understood and appreciated by reference to the description of the current embodiments and the drawings.

BRIEF DESCRIPTION OF THE DRAWINGS

FIG. 2 is a schematic cross-sectional view of a portion of the illumination assembly of FIG. 1 according one embodiment of the invention.

FIG. 3 is a schematic cross-sectional view of a portion of the illumination assembly of FIG. 1 according one embodiment of the invention.

DESCRIPTION OF THE CURRENT EMBODIMENTS

I. Structure

Figure 1:
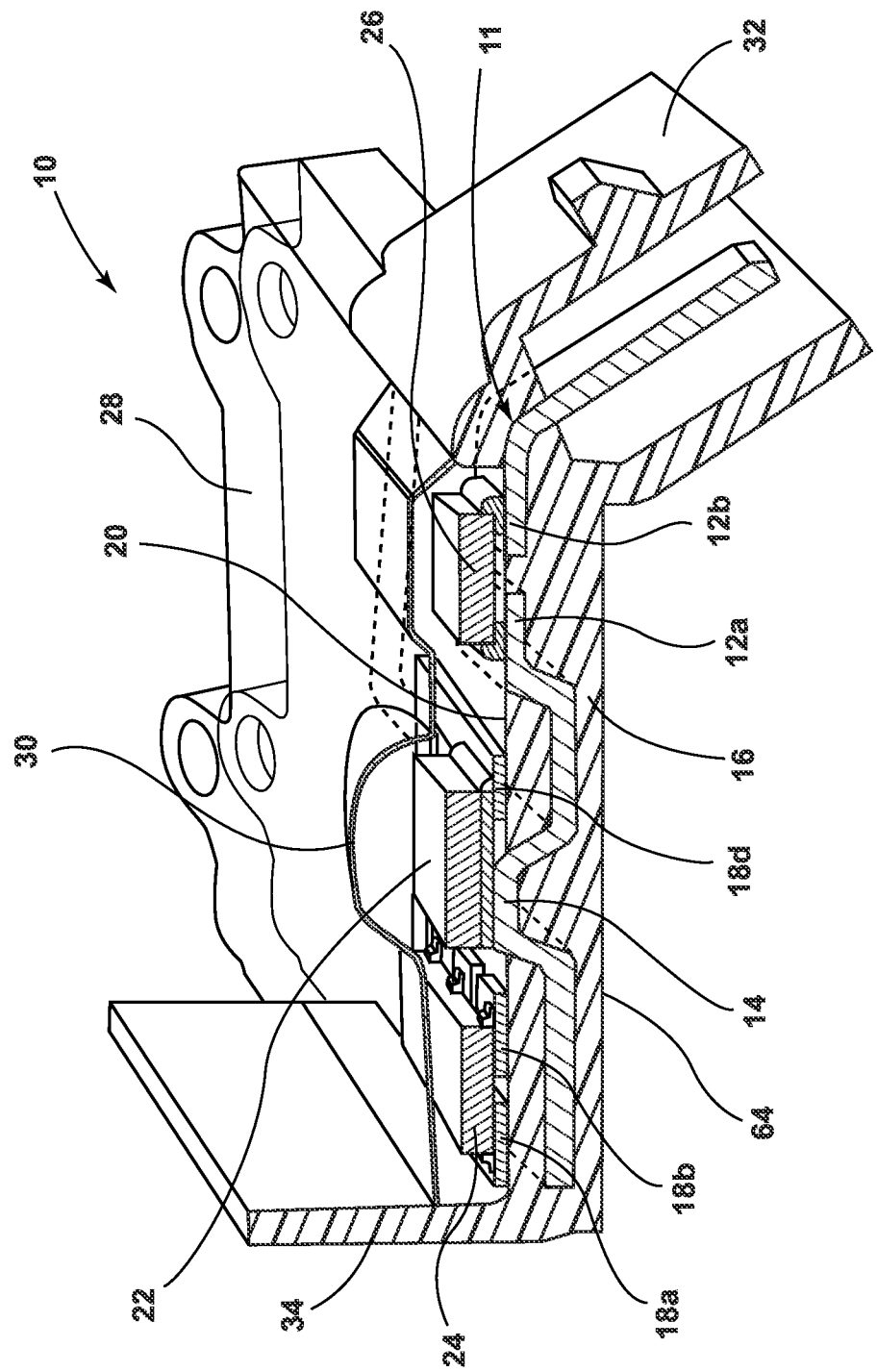
FIG. 1 is a perspective view of a cross-section of an illumination assembly according to a first embodiment of the invention.

With reference to FIG. 1, an illumination assembly 10 is illustrated in accordance with a first embodiment of the invention. The illumination assembly 10 can include an electrical circuit 11 comprising a plurality of circuit traces which include at least two conductors 12a-b for providing electrical current to connected components and at least one heat spreader 14 for dissipating thermal energy (i.e. heat) generated by an electrical component. The conductors 12a-b can be supported by a polymeric substrate 16 made of a first polymeric material. In the present example in which the conductors 12a-b are at least partially embedded within the polymeric substrate 16, the conductors 12a-b can also be referred to as embedded conductors. The electrical circuit 11 can also include a plurality of circuit traces which include printed conductors 18a-d (see also FIG. 2) which are also supported by the polymeric substrate 16 by printing the conductors 18a-d on an interior surface 20 of the polymeric substrate 16. The illumination assembly 10 can also include a light source 22, such as a light emitting diode (LED), and additional electrical components 24-26, non-limiting examples of which include a resister, diode, capacitor, conductor, another LED, or any other suitable electrical components.

At least a portion of the printed conductors 18a-d, LED 22, and electrical components 24-26 can be covered by and/or embedded within a first polymeric layer 28 made of a second polymeric material. In this manner, the polymeric substrate 16 can form a first housing portion and the first polymeric layer 28 can form a second housing portion, with the first and second housing portions 16 and 28 encompassing the elements of the electrical circuit 11. The first polymeric layer 28 can include a lens portion 30 adjacent the LED 22 for directing light emitted by the LED 22. The polymeric substrate 16 and/or the first polymeric layer 28 can be formed to include additional structures, non-limiting examples of which include a connector portion 32, a light blocking feature 34, and attachment apertures 36. The polymeric substrate 16 and the first polymeric layer 28 can be made from the same or different material. Both the polymeric substrate 16 and the first polymeric layer 28 can be made from an electrically insulating material that can optionally be thermally conductive. Non-limiting examples of materials suitable for the polymeric substrate 16 and/or the first polymeric layer 28 include acrylics, polycarbonates, silicones, polyethylene terephthalate, acrylonitrile butadiene styrene (ABS), Poly [[5-(2-ethylhexyl)-5,6-dihydro-4,6-dioxo-4H-thieno[3,4-c]pyrrole-1,3-diyl][4,8-bis[(2-ethylhexyl)oxy]benzo[1,2-b:4,5-b']dithiophene-2,6-diyl]] (PBDT-TPD), N,N'-Bis(3-methylphenyl)-N,N'-diphenylbenzidine (TPD), polybutylene terephthalate (PBT) based materials, and combinations thereof. The polymeric substrate 16 and the first polymeric layer 28 can be made from the same or different materials. In one example, the first polymeric layer 28 can be made of a transparent moldable material, non-limiting examples of which include acrylics, polycarbonates, silicones, and ABS based materials.

In the embodiment of FIG. 1, the electrical circuit 11 includes at least one pair of embedded conductors 12a-b that are at least partially embedded within the polymeric substrate 16 as well as printed conductors 18 that are printed onto the interior surface 20 of the polymeric substrate 16. In one example, the embedded conductors 12a-b can be made from a single sheet of metal that is cut to isolate various components of the circuit 11 as desired or each trace of the electrical circuit 11 can be independently formed and electrically coupled or isolated as desired depending on the design of the circuit. The embedded conductors 12a-b can be made from metals such as plated steel, brass, copper, or other materials known in the art.

Figure 5:
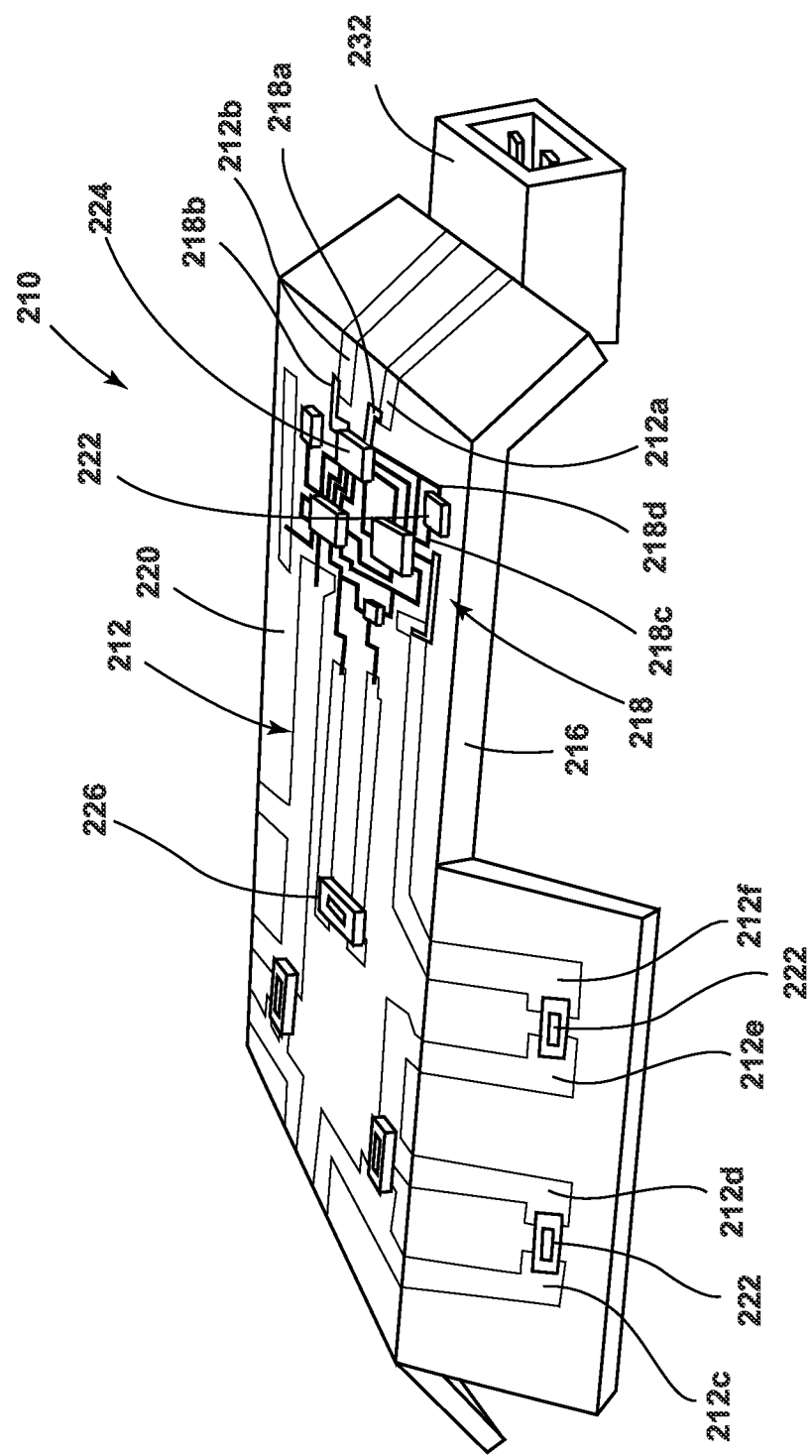
FIG. 5 is a perspective view of an illumination assembly according to another embodiment of the invention.

One or more of the printed conductors 18a-d can be electrically coupled with the electrical circuit 11 through at least one pair of embedded conductors (such as illustrated in FIG. 5) for receiving electrical current from a suitable current source (not shown) coupled with the electrical circuit 11 through the connector portion 32. The printed conductors 18a-d can be printed using conductive inks, non-limiting examples of which include inks containing graphine or metallic nanoparticles, such as copper nanoparticle-based inks. Examples of commercially available inks include DuPont 5025, PE825, and 5043, all of which are a silver composite conductor ink available from DuPont®, and the Electrodag™ family of conductive inks available from Henkel. The printed conductors 18a-d can be directly printed onto exposed terminals of embedded conductors of the electrical circuit 11 to electrically couple the printed conductors 18a-d to the conductors. Alternatively, the printed conductors 18a-b can be coupled to the embedded conductors of the electrical circuit 11 by a solder joint or a conductive epoxy joint. The printed conductors 18a-d can be printed and cured using any suitable technique, non-limiting examples of which include silk screen, stencil, laser sinter, laser etch, chemical etch, and additive printing.

Referring now to FIG. 2, the LED 22 can be electrically coupled with the printed conductors 18c-d for receiving electrical current and thermally coupled with the heat spreader 14 for dissipating heat generated by the LED 22. As shown schematically in FIG. 2, the printed conductors 18c-d each include terminals 50 and 52 to which the LED 22 can be electrically coupled to allow current to flow through the LED 22. The LED 22 includes connectors 54 and 56 which can be electrically coupled to the adjacent terminals 50 and 52, respectively. The LED connectors 54 and 56 can be in the form of leads that can be coupled with the adjacent terminals 50 and 52 through soldering. Alternatively, the LED 22 can be coupled with the terminals 50 and 52 using a conductive epoxy, such as an epoxy doped with silver fragments or particles and/or other conductive metals.

The LED 22 can span a gap 58 between the printed conductors 18c and 18d. The heat spreader 14 can be thermally coupled with the LED 22 in the gap 58 for dissipating heat generated by the LED 22. The LED 22 can include a heat conducting component 59, such as a metal plate, joined with or at least partially embedded within the body of the LED 22 component. As illustrated in FIG. 2, the heat spreader 14 can include an exposed portion 60 that extends beyond the interior surface 20 of the polymeric substrate 16 for direct contact with the metal plate 59 of the LED 22 and an unexposed portion 62 that does not extend beyond the interior surface 20. The heat spreader 14 can be configured such that a majority of the heat spreader 14 does not extend beyond the interior surface 20 and thus the heat spreader 14 can be considered as being predominately disposed exteriorly of the interior surface 20. The unexposed portion 62 can be completely embedded within the polymeric substrate 16 (as shown) or, alternatively, the unexposed portion 62 can extend beyond an exterior surface 64 of the polymeric substrate 16. An additive, such as solder, a thermally conductive epoxy, grease, or other coating can optionally be provided between the exposed portion 60 of the heat spreader 14 and the metal plate 59 to facilitate securing the LED 22 in place and/or to facilitate thermal contact between the LED 22 and the heat spreader 14.

While the heat spreader 14 is illustrated as having a generally arched-shaped cross-section, it will be understood that the heat spreader 14 can have a variety of different cross-sectional shapes depending on the design of the illumination assembly. For example, the heat spreader 14 can be a material having a non-uniform thickness rather than the arched-shape cross-sectional shape illustrated in FIG. 2.

With reference to FIG. 3, in another example, the heat spreader 14 does not include a portion that extends beyond the interior surface 20 and thus the heat spreader 14 can be considered as being entirely disposed exteriorly of the interior surface 20. In this example, the heat spreader 14 is not in direct contact with the LED 22, but can be thermally coupled to the LED 22 through the polymeric substrate 16, which can be made from a thermally conductive and electrically insulating material. Heat generated by the LED 22 transferred to the conductors 18c-d can also be dissipated by the heat spreader 14 through the polymeric substrate 16. The metal plate 59 of the LED 22 can be configured to be in thermal contact with the polymeric substrate 16 to facilitate heat transfer from the LED 22 to the heat spreader 14. While the heat spreader 14 is illustrated as being embedded within the polymeric substrate 16, the heat spreader 14 can also include a portion that extends beyond the exterior surface 64 of the polymeric substrate 16 to increase the surface area of the heat spreader 14 and increase the amount of heat dissipated.

Referring again to FIG. 1, the additional electrical components 24-26 can be electrically coupled with the printed conductors 18a-b (e.g. electrical component 24) or with the embedded conductors 12a-b (e.g. electrical component 26). The embedded conductors 12a-b and the heat spreader 14 can include exposed portions on the interior surface 20 of the polymeric substrate 16 for coupling with an electrical component, as illustrated in FIGS. 1-2. Alternatively, the embedded conductors 12a-b and/or heat spreader 14 can be completely encapsulated within the polymeric substrate 16 and an additional component coupled with the embedded conductors 12a-b and/or heat spreader 14 can project from the interior surface 20 of the polymeric substrate 16 for coupling the electrical component with the embedded conductors 12a-b and/or heat spreader 14.

The polymeric substrate 16 and first polymeric layer 28 can be the same or different and are preferably made from a non-conducting polymeric material that can be molded around the components of the illumination assembly 10. The polymeric substrate 16 and first polymeric layer 28 can be molded around the components of the illumination assembly 10 according to any known method, examples of which are disclosed in U.S. Pat. No. 7,909,482 to Veenstra et al., entitled "Electrical Device Having Boardless Electrical Component Mounting Arrangement," issued Mar. 22, 2011, which is incorporated herein by reference in its entirety.

Figure 4:
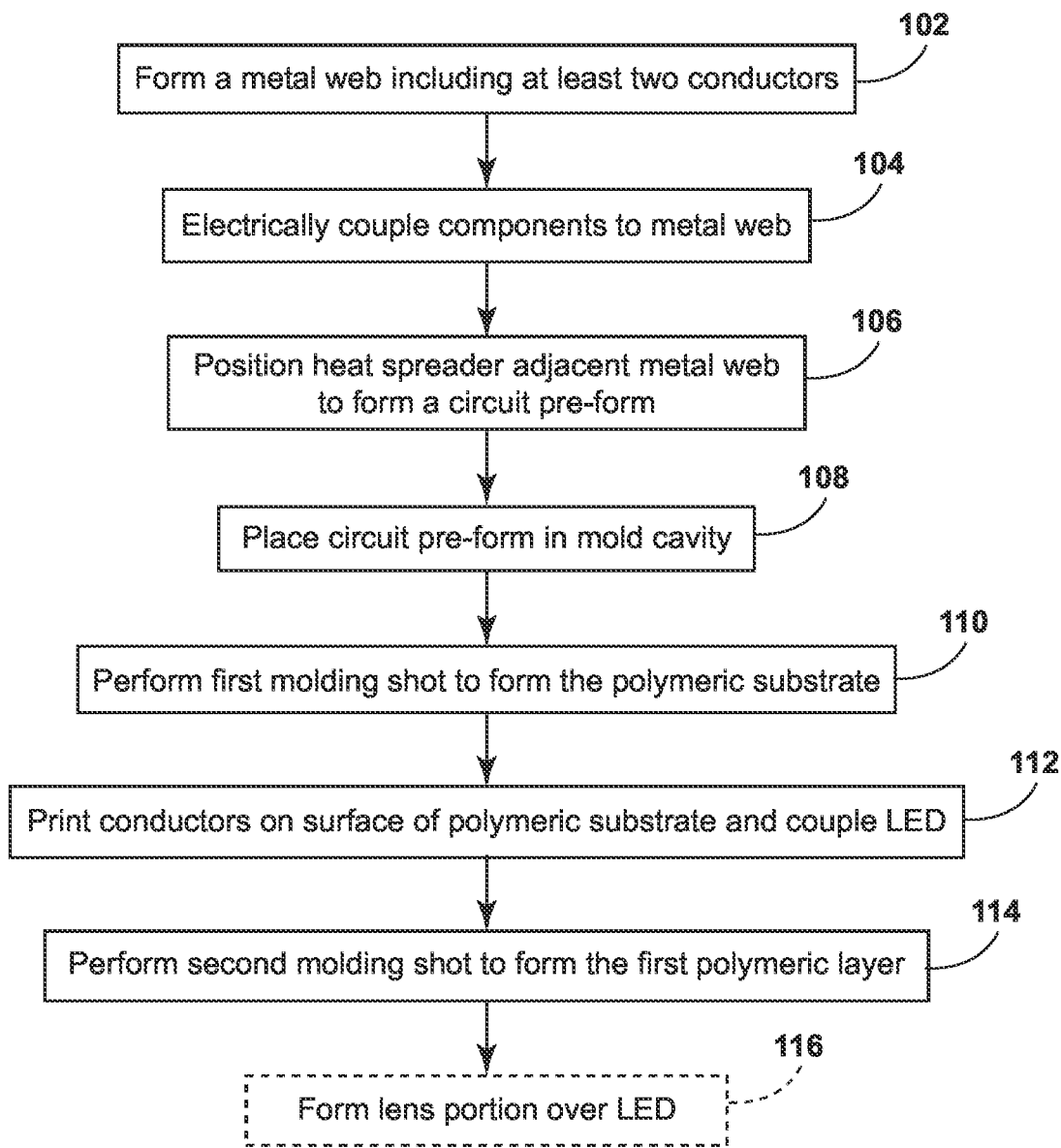
FIG. 4 illustrates a process for forming an illumination assembly according to another embodiment the invention.

FIG. 4 illustrates an exemplary method 100 for forming the illumination assembly 10 according to a two-shot molding process similar to that which is disclosed in U.S. Pat. No. 7,909,482 to Veenstra et al. The method 100 can begin at 102 with forming a metal web that includes at least two conductive circuit elements which will form the basis for the embedded conductors 12a-b. The at least two conductive circuit elements can be made from cutting, bending, and/or stamping a metal sheet to form the metal web having the desired conductors 12a-b.

At 104 any LEDs or other electrical components that are to be electrically coupled directly with the embedded conductors 12a-b, such as electrical component 26, are coupled with the appropriate conductors using soldering or any other suitable method. At 106 the heat spreader 14 can be positioned adjacent the metal web in a position corresponding to where the LED 22 will be located. The heat spreader 14 can be a thermally conductive component that can be made from the same material as the metal web at 102 or a different material. In an exemplary embodiment, the heat spreader 14 is a portion of the metal web that is electrically isolated from current flow through the web.

The thus assembled web, electrical components, and heat spreader 14 form a circuit pre-form that can be placed within a cavity of a tooling mold having a shape corresponding to the first housing portion that is formed by the polymeric substrate 16 at 108. While the heat spreader 14 is described as being placed in the mold cavity at the same time as the assembled web, it is also within the scope of the invention for the heat spreader 14 to be a separate element that is placed in the mold cavity before or after the assembled web.

The first polymeric material is provided in molten form to the mold cavity at 110 in a first molding shot to form the polymeric substrate 16 in which the web, electrical components, and heat spreader 14 are at least partially embedded. The mold can be configured to leave at least a portion of the heat spreader 14 exposed on the interior surface 20 of the polymeric substrate 16, as illustrated in FIG. 2, or the mold can be figured such that no portion of the heat spreader 14 extends beyond the interior surface 20, as illustrated in FIG. 3. Additional portions of the web can also be left exposed as needed for coupling additional electrical components with the web after the first molding shot.

At 112, the printed conductors 18a-d can be printed onto the interior surface 20 of the polymeric substrate 16 adjacent the heat spreader 14. In one example, the conductors 18a-d can be printed using a printer with a print head with X-Y motion control relative to the polymeric substrate 16 according to an additive screen printing process. The LED 22 can be electrically coupled to the printed conductors 18c-d and thermally coupled with the heat spreader 14 in the manner described above in FIGS. 2 and 3. Additional electrical components 24 can be electrically coupled with the printed conductors 18a-b as desired to form the completed electrical circuit.

At 114, the completed electrical circuit can be placed within a second mold cavity having a shape corresponding to the second housing portion that is formed by the first polymeric layer 28. The second polymeric material can be provided in molten form to at least partially embed/cover the LED 22, electrical components 24, 26, and printed conductors 18a-d within the first polymeric layers 28 in a second molding shot. The second polymeric material can be the same or different than the first polymeric material in the first molding shot at 110. In one example, the second polymeric material can be a material that allows at least a portion of the light emitted from the LED 22 to travel through the second polymeric material to an exterior of the illumination assembly 10 for providing illumination. The second polymeric material can be transparent, translucent and/or colored to provide the emitted light with the desired characteristics.

Alternatively, the method 100 can include an optional additional step 116 for forming the lens portion 30 above the LED 22. In one example, the lens portion 30 can be formed in a third molding shot using a third polymeric material that is different from the second polymeric material to provide the desired light emitting characteristics. Additionally, or alternatively, the formation of the lens portion 30 can include treating the polymeric material molded over the LED 22 to provide the desired light emitting characteristics. For example, the polymeric material molded over the LED 22 can include a three-dimensional shape and/or texture configured to control the distribution of light emitted through the lens portion 30. In one example, the lens portion 30 can be made from any suitable transparent material, non-limiting examples of which include acrylics, polycarbonates, silicones, and ABS based materials.

In another example, the second molding shot at 114 may include leaving an opening in the first polymeric layer 28 in the area above the LED 22 to allow at least a portion of the light emitted by the LED 22 to escape from the lighting assembly 10 unimpeded by the first polymeric layer 28. In this example, the lighting assembly 10 can be coupled with a device, such as a vehicle tail light, which includes a component that can operate as a lens for the light emitted by the LED 22.

While each of the polymeric substrate 16 and the first polymeric layer 28 are described as being formed in a single shot, it is within the scope of the invention that one or more shots may be used to form the polymeric substrate 16 and/or the first polymeric layer 28.

Each of the steps of the method 100 can be modified depending on the manner in which the electrical circuit 11, electrical components 22-26, and heat spreader 14 are configured. For example, in a configuration in which the heat spreader 14 is embedded within the first polymeric layer 28, rather than the polymeric substrate 16, such as in the embodiment of FIG. 6, the heat spreader 14 can be assembled with the electrical circuit 11 during the second molding shot at 114 instead of the first molding shot at 110. In another example, if the electrical circuit 11 does not include any embedded conductors, such as the embodiments of FIGS. 6 and 7, the first molding shot at 110 can be used to form the polymeric substrate 16 for supporting conductors that are either set down or printed onto the polymeric substrate 16.

II. Operation

In use, the illumination assembly 10 can be coupled with a suitable power source through the connector portion 32 to supply electrical current to the electrical circuit 11. Electrical current can flow through the embedded conductors 12a-b and the printed conductors 18a-d to provide power to the various electrical components 24-26, including the LED 22. Thermal energy generated by the LED 22 during operation of the LED 22 can be dissipated through the heat spreader 14, either directly, or through the polymeric substrate 16.

The illumination assembly 10 can provide a multi-layer assembly which layers a heat spreader, a non-conductive polymeric material, electrical conductors, and an LED to facilitate thermal energy management. Improved heat management can facilitate forming illumination assemblies having more advanced electronic functionality and higher power levels that do not overheat during use. Generally, an LED is considered high power if it operates at 350 mA or more and consumes greater than 1 watt. For example, improved heat management can allow for the use of thinner polymeric layers forming the polymeric substrate 16 and the first polymeric layer 28 while still enabling advanced circuit functions and high power LEDs without overheating. Decreasing thickness of the polymeric substrate 16 and/or the first polymeric layer 28 can save on material costs and increase flexibility in satisfying the desired form factor of the lighting assembly 10 based on its intended end use.

In addition, the first polymeric layer 28 can provide a mechanical seal for holding elements of the lighting assembly 10 in place and optionally provide a moisture seal to protect the electronics from moisture damage. The materials for the polymeric substrate 16 and the first polymeric layer 28 can be selected such that the first polymeric layer 28 is bonded to the exposed surfaces of the polymeric substrate 16 during the molding process. The bonded first polymeric layer 28 can facilitate securing the LED 22 and other electrical components 24, 26 in place, which can decrease the likelihood of these components becoming dislodged and losing their connection to the electrical circuit 11 and/or the heat spreader 14. The bonded first polymeric layer 28 may also facilitate securing the connection between the printed conductors 18 and the embedded conductors 12. The bonded first polymeric layer 28 can also inhibit moisture from infiltrating the circuit and potentially electrically shorting the connection between the electrical components 22-26 and the conductors 12, 18 and between the printed and embedded conductors 12 and 18.

III. Additional Embodiments

FIG. 5 illustrates an example of a lighting assembly 210 that is similar to the lighting assembly 10 except for the configuration of the electrical circuit. Therefore, elements of the lighting assembly 210 similar to those of the lighting assembly 10 are labeled with the prefix 200.

The illumination assembly 210 is shown without the first polymeric layer 228 for clarity. The polymeric substrate 216 extends in multiple dimensions and includes a connector portion 232 for connecting the illumination assembly 210 to a suitable power source. The electrical circuit 211 includes a combination of multiple conductors 212a-f embedded within the polymeric substrate 216 and multiple printed conductors 218a-d printed onto the interior surface 220 of the polymeric substrate 216. The printed conductors 218a-d can be connected to one or more embedded conductors, such as embedded conductors 212a-b, to provide current flow to the printed conductors 218a-d.

The electrical circuit 211 also includes multiple electrical components 222-226 connected to the embedded conductors 212a-f or the printed conductors 218a-d. For example, LEDs 222a-b can be connected to embedded conductors 212c-d and 212e-f and an additional LED 222c can be connected to printed conductors 218c-d. A heat spreader (not shown) can be thermally coupled to one or more of these LEDs 222a-c as needed in a manner similar to that discussed above with respect to FIGS. 2 and 3. Additional electrical components, such as electrical components 224 and 226 can be connected to other printed conductors or embedded conductors based on the design of the circuit.

The embedded and printed conductors 212 and 218, respectively, extend across multiple planes of the multi-planar polymeric substrate 216 and thus the illumination assembly 210 can emit light in multiple directions by providing the LEDs 222 in different planes. The printed conductors 218 can be printed with narrower widths and higher densities than the embedded conductors 212 and thus facilitate increasing the complexity of the circuit by increasing connector densities and/or decreasing the size of the circuit needed to support the desired electrical components. The larger embedded conductors 212 can be used as needed based on the power requirements of the electrical components connected to the embedded conductors 212. The printed conductors 218 are typically more expensive than the embedded conductors 212 and thus the embedded conductors 212 can be used where feasible to decrease costs compared to a circuit made predominately of printed conductors.

Figure 6:
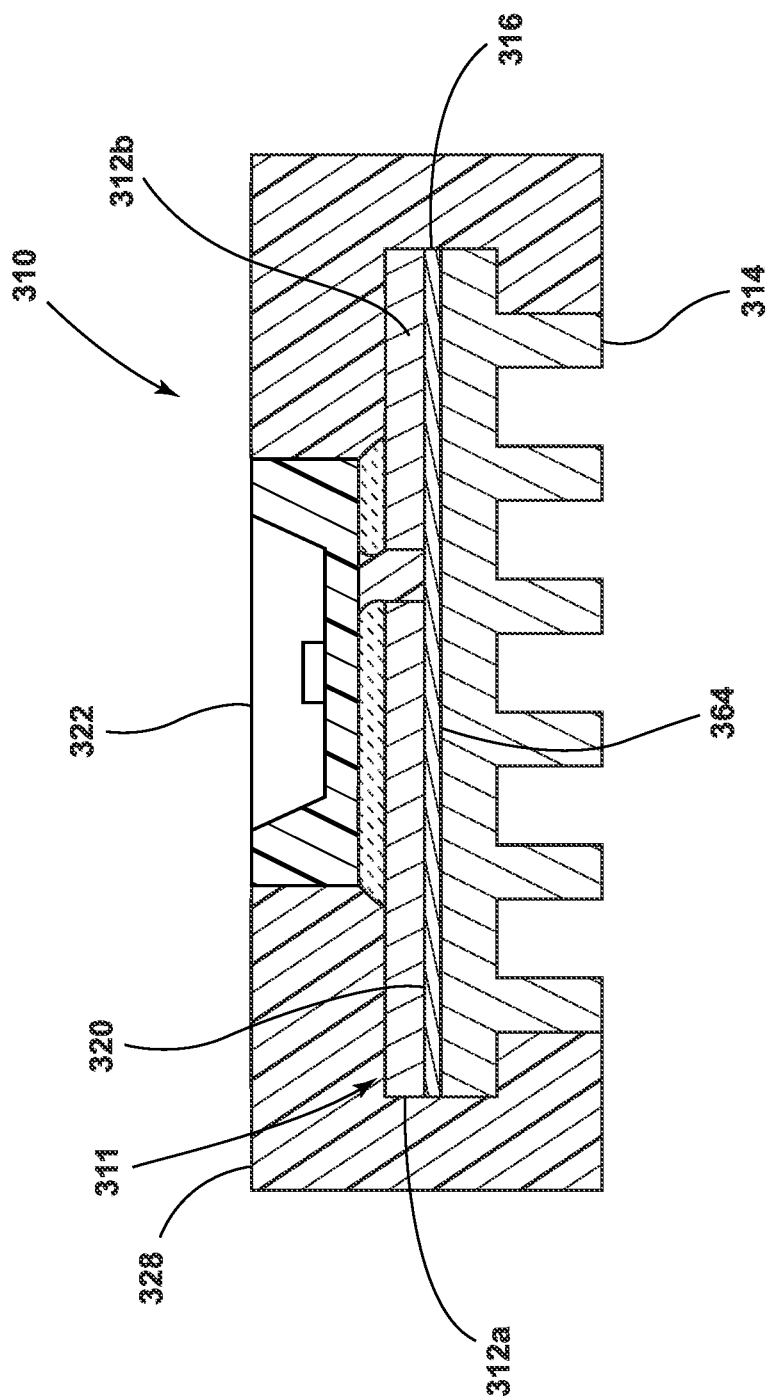
FIG. 6 is a cross-sectional view of a portion of an illumination assembly according to another embodiment of the invention.

FIG. 6 illustrates an example of a lighting assembly 310 that is similar to the lighting assembly 10 except for the configuration of the electrical circuit and the polymeric substrate. Therefore, elements of the lighting assembly 310 similar to those of the lighting assembly 10 are labeled with the prefix 300. FIG. 6 illustrates a portion of the lighting assembly 310 that includes a single LED; however, the lighting assembly 310 can be part of a more complex lighting assembly that includes a larger electrical circuit and multiple components, such as that shown in FIG. 1 or FIG. 5, for example.

In the lighting assembly 310, the polymeric substrate 316 can be in the form of a film or a layer of molded polymeric material that is thermally conductive and electrically insulating. Generally, the thinner the polymeric substrate 316, the more efficient the heat transfer is to the adjacent heat spreader 314. Additional factors, such as the form factor of the device in which the lighting assembly 310 is to be used and/or manufacturing limitations may also effect the thickness of the polymeric substrate 316.

The conductors 312a-b can be printed onto the polymeric substrate 316 in a manner similar to that described above with respect to the printed conductors 18 of the illumination assembly 10. Alternatively, the conductors 312a-b can be non-printed conductors that are supported by the polymeric substrate 316 by lying on the interior surface 320 or being at least partially embedded within the polymeric substrate 316. For example, the conductors 312a-b can be formed using a metal web as described above for the method 100 of FIG. 4. In this scenario, the supported conductors 312a-b can be partially embedded within the polymeric substrate 316 or be supported by the interior surface 320 such that the conductors 312a-b are predominately disposed on the interior side of the polymeric substrate 316.

The LED 322 can be electrically coupled to the conductors 312*a-b* in a manner similar to that described above with respect to the illumination assembly 10 of FIG. 1, such as through soldering or a conductive epoxy. The heat spreader 314 can be disposed adjacent the LED 322 for dissipating heat generated by the LED. In the embodiment of FIG. 6, the heat spreader 314 is not in direct contact with the LED 322 and is located entirely exteriorly of the interior surface 320 of the polymeric substrate 316. Heat generated by the LED 322 is transferred through the conductors 312*a-b*, through the polymeric substrate 316, and to the heat spreader 314.

The first polymeric layer 328 can be molded around the LED 322, the conductors 312*a-b*, the polymeric substrate 316, and the heat spreader 314 to secure these elements of the lighting assembly 310 together without the use of mechanical fasteners. The molded first polymeric layer 328 can also provide a moisture seal to inhibit moisture from interfering with the electrical connections between the LED 322 and the conductors 312*a-b*. The first polymeric layer 328 can be molded around only a portion of the heat spreader 314, as illustrated, such that portions of the heat spreader 314 can be exposed to atmosphere or an adjacent component in the end use device to facilitate heat dissipation. However, the first polymeric layer 328 could optionally be molded around the entire heat spreader 314. The first polymer layer 328 can be molded at least partially around the heat spreader 314 such that the first polymer layer 328 secures the heat spreader 314 in place and/or an adhesive can be used to secure the heat spreader 314 in place relative to the LED 322.

The lighting assembly 310 can be part of a more complex and multi-dimensional circuit that includes multiple electrical components. Individual heat spreaders 314 can be provided adjacent each LED or other electrical component, as needed, to dissipate heat, including components positioned in different planes. This allows for the location and/or the size of the heat spreader to be customized for each LED or other electrical component and facilitates forming lighting assemblies that satisfy more complex form factors.

The lighting assembly 310 can be part of a multi-component and multi-dimensional assembly, similar to those illustrated in FIGS. 1 and 4. The lighting assembly 310 can be used with an electrical circuit that includes conductors supported by the polymeric substrate 316 in the same manner as the conductors 312*a-b* or a combination of different types of conductors, including embedded and/or printed conductors.

Figure 7:
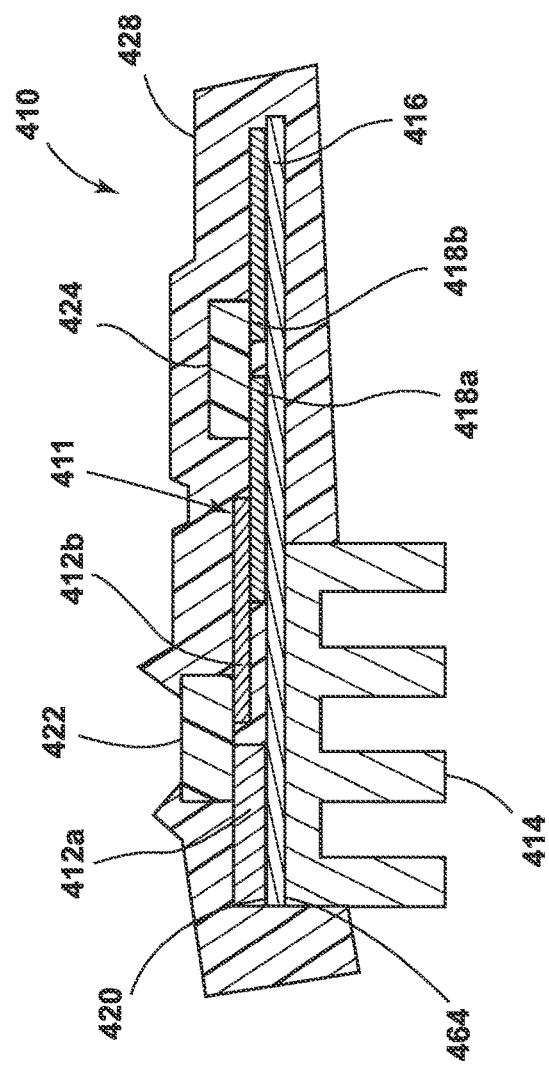
FIG. 7 is a cross-sectional view of a portion of an illumination assembly according to another embodiment of the invention.

For example, FIG. 7 illustrates a lighting assembly 410 similar to that of the lighting assembly 310 except for differences in the electrical circuit and the first polymeric layer. Elements of the lighting assembly 410 similar to those of the lighting assembly 310 are labeled with the prefix 400.

As illustrated in FIG. 7, the electrical circuit 411 can include conductors 412*a-b* supported on the interior surface 420 of the polymeric substrate 416 as well as printed conductors 418*a-b* that are printed onto the interior surface 420. The LED 422 can be electrically connected to the conductors 412*a-b* and thermally coupled to the heat spreader 422. An additional electrical component 424 can be connected to the printed conductors 418*a-b*.

The polymeric substrate 416 can be in the form of a film or a layer of molded polymeric material having a desired thickness. The first polymeric layer 418 can be molded around the LED 422, the conductors 412*a-b*, the conductors 418*a-b*, the polymeric substrate 416, and the heat spreader 414 to secure these elements of the lighting assembly 410 together without the use of mechanical fasteners and to optionally provide a moisture seal to inhibit moisture from interfering with the electrical connections in the circuit 411.

The size and the location of the heat spreader 414 can be configured to accommodate only the LED 422 rather than both the LED 422 and the electrical component 424. Customizing the size and the location of the heat spreader 414 based on the heat dissipation needs of the circuit can decrease the parts and materials used in the lighting assembly 411 and facilitate designing lighting assemblies that are multi-dimensional.

Figure 8:
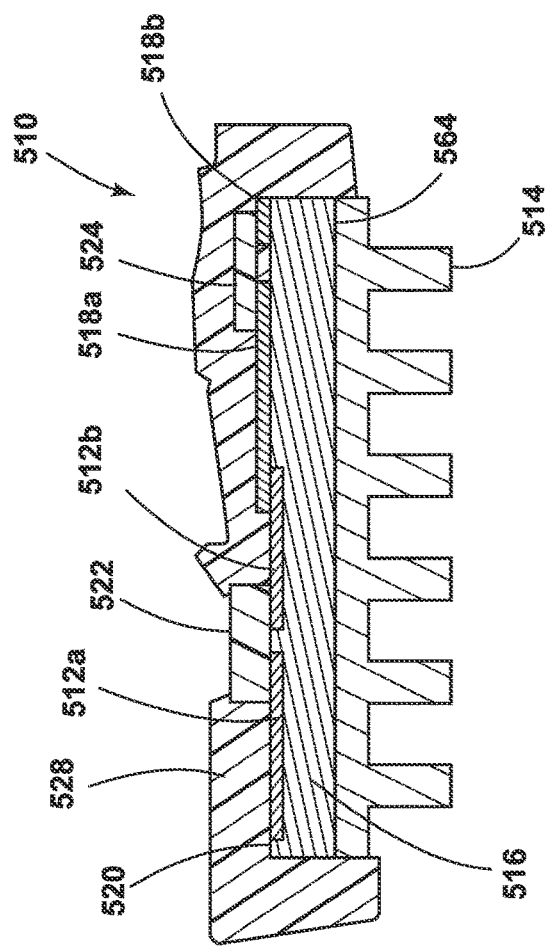
FIG. 8 is a cross-sectional view of a portion of an illumination assembly according to another embodiment of the invention.

FIG. 8 illustrates another example of a lighting assembly 510 that is similar to the lighting assemblies 310 and 410 except for differences in the electrical circuit, the heat spreader, and the first polymeric layer. Elements of the lighting assembly 510 similar to those of the lighting assembly 310 and 410 are labeled with the prefix 500.

In the example of FIG. 8, the lighting assembly 510 includes embedded conductors 512*a-b*, printed conductors 518*a-b*, an LED 522 electrically coupled to the embedded conductors 512*a-b*, and an additional electrical component 524 electrically coupled to the printed conductors 518*a-b*. The first polymeric layer 528 can be molded around the LED 522, the conductors 512*a-b*, the polymeric substrate 516, the electrical component 524, and the printed conductors 518*a-b* to secure these elements together and optionally inhibit moisture from contacting the circuit.

The heat spreader 514 in this example is a separate component that is not coupled with the other components of the assembly 510 by the over-molded first polymeric layer 528. The heat spreader 514 can be secured adjacent the exterior surface 564 of the polymeric substrate 516 using an adhesive or mechanical fasteners. In one example, the heat spreader 514 can be part of the end use device to which the lighting assembly 510 is intended for use and coupling the lighting assembly 510 with the end use device also couples the heat spreader 514 to the lighting assembly 510. For example, the heat spreader 514 could be a thermally conductive part of a lamp which is intended for use with the lighting assembly 510. This configuration can provide a heat spreader having a large surface to facilitate heat dissipation and can also simplify manufacturing of the lighting assembly 510. It is also within the scope of the invention for the first polymeric layer 528 to be over-molded around the heat spreader 514 to secure the heat spreader 514 in place in a manner similar to that described above for the lighting assembly 310 and 410.

Figure 9:
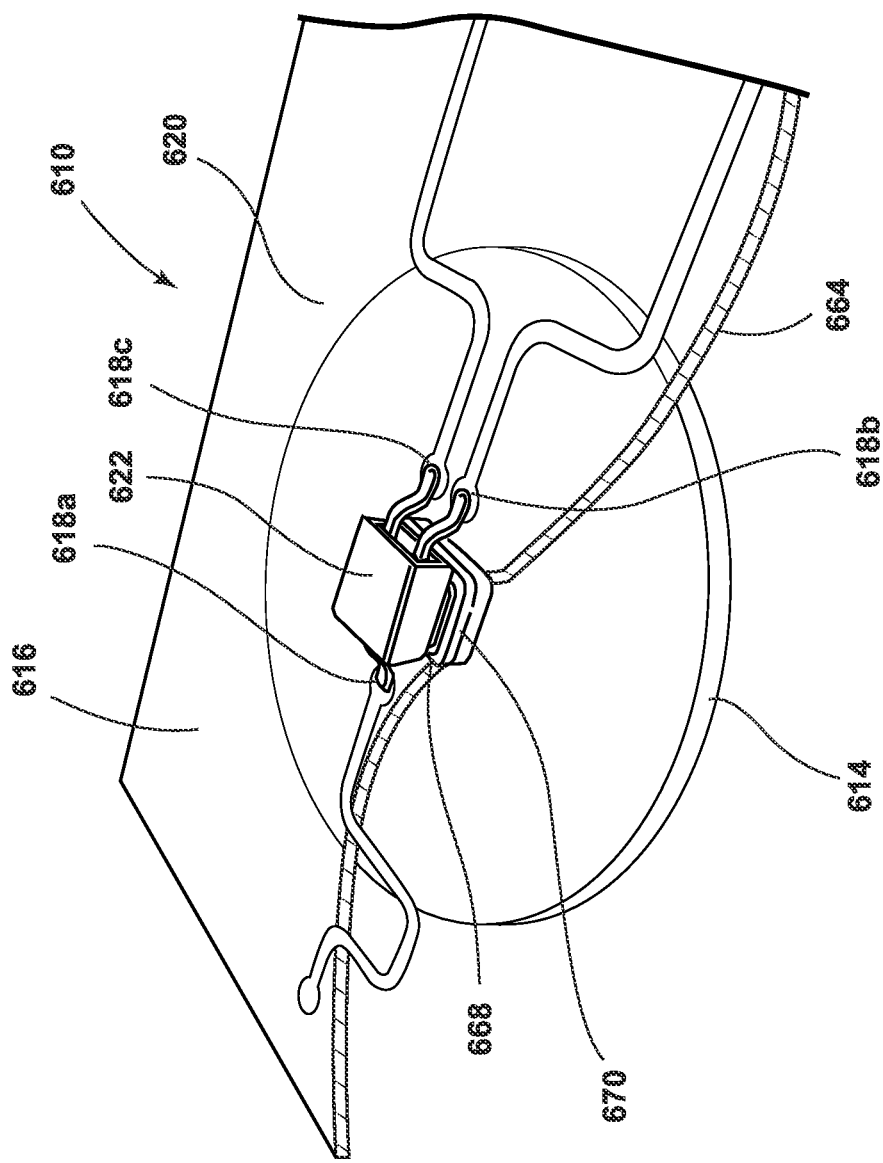
FIG. 9 is a cross-sectional view of a portion of an illumination assembly according to another embodiment of the invention.

FIG. 9 illustrates another example of a lighting assembly 610 that is similar to the lighting assembly 10 except for differences in the electrical circuit, the heat spreader, and the first polymeric layer. Elements of the lighting assembly 610 similar to those of the lighting assembly 10 are labeled with the prefix 600. FIG. 9 illustrates a portion of the lighting assembly 610 that includes a single LED; however, the lighting assembly 610 can be part of a more complex lighting assembly that includes a larger electrical circuit and multiple components, such as that shown in FIG. 1 or FIG. 5, for example.

The lighting assembly 610 includes a polymeric substrate 616 in the form of a thin film or sheet of polymeric material. Multiple conductors 618*a-c* can be printed onto the interior surface 620 of the polymeric substrate 616 for supplying electrical current to the LED 622. The polymeric substrate 616 can include an aperture 668 adjacent the LED 622 through which a thermal management device 670 extends to thermally couple the LED 622 with the heat spreader 614 disposed on the exterior side 664 of the polymeric substrate 616. The thermal management device 670 can be a separate component or can be integrally formed with the heat spreader 614. For example, the heat spreader 614 can be a molded aluminum or copper heat sink that includes a raised portion forming the thermal management device 670 that is configured to extend through the aperture 668 to thermally couple the LED 622 with the heat spreader 614.

The polymeric substrate 616 can be made of a non-conductive material according to any known film-forming process. The polymeric substrate 616 can be pre-formed, with or without the aperture 668, or formed in-line with one or more components of the lighting assembly 610. For example, the conductors 618*a-c* can be printed onto the pre-formed polymeric substrate 616, the thermal management device 670 and the heat spreader 614 can be assembled with the polymeric substrate, and the LED 622 can be electrically coupled to the conductors 618*a-c*. In another example, the polymeric substrate 616 can be formed around the assembled thermal management device 670 and heat spreader 614.

Figure 10:
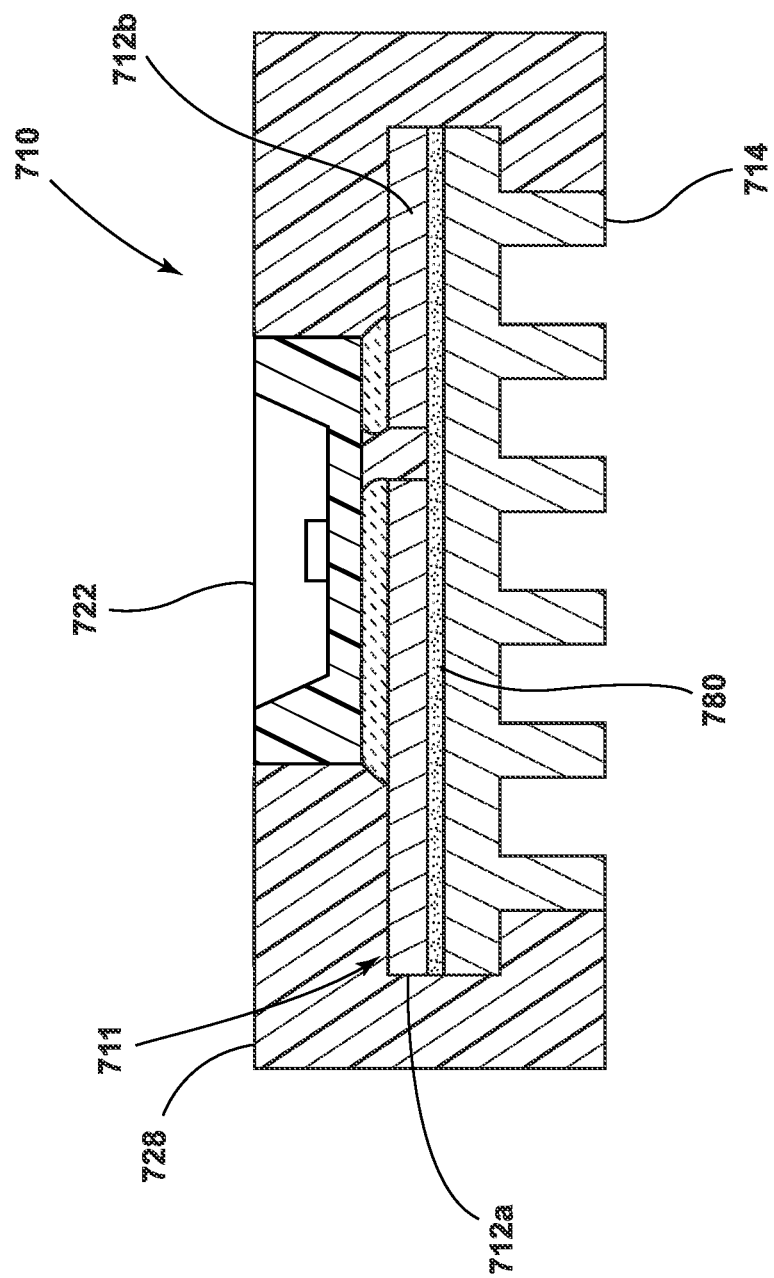
FIG. 10 is a cross-sectional view of a portion of an illumination assembly according to another embodiment of the invention.

FIG. 10 illustrates another example of a lighting assembly 710 that is similar to the lighting assembly 310 of FIG. 6 except for differences in the heat spreader, the polymeric substrate, and the first polymeric layer. Elements of the lighting assembly 710 similar to those of the lighting assembly 310 are labeled with the prefix 700. FIG. 10 illustrates a portion of the lighting assembly 710 that includes a single LED; however, the lighting assembly 710 can be part of a more complex lighting assembly that includes a larger electrical circuit and multiple components, such as that shown in FIG. 1 or FIG. 5, for example.

The lighting assembly 710 of FIG. 10 includes a thermal interface layer 780 thermally coupling the heat spreader 714 and the LED 722 that is not a molded polymeric substrate material. The thermal interface layer can be a thermal interface material (TIM) that is thermally conductive, but electrically insulating. Non-limiting examples of suitable thermal interface materials include ceramic impregnated epoxies or silicones, graphine, carbon nanotubes, nano-glue, ceramic coated copper, ceramic coated aluminum, and oxidized aluminum. The thermal interface layer 780 can be applied at least to an interior surface of the heat spreader 714 adjacent the LED 722 in the assembled lighting assembly 710 and can be a separate layer or a layer that is integrally formed with the heat spreader 714. In one example, the thermal interface layer 780 can be formed by oxidizing the interior surface of an aluminum heat spreader 714.

In the embodiment of FIG. 10, the first polymeric layer 728 and/or the heat spreader 714 can provide the support structure for the electrical circuit 711 in the absence of a separate polymeric substrate layer (such as the polymeric substrate 316 of FIG. 6). The first polymeric layer 728 can function as both the over-molded polymeric layer that provides a mechanical seal for holding elements of the lighting assembly 710 together as well as provide a substrate for supporting elements of the electrical circuit 711. The heat spreader 714 can optionally provide additional structural support to one or more components of the electrical circuit 711. In this manner, the lighting assembly 710 can be formed from a single-shot molding process, rather than a multiple-shot molding process.

Figure 11:
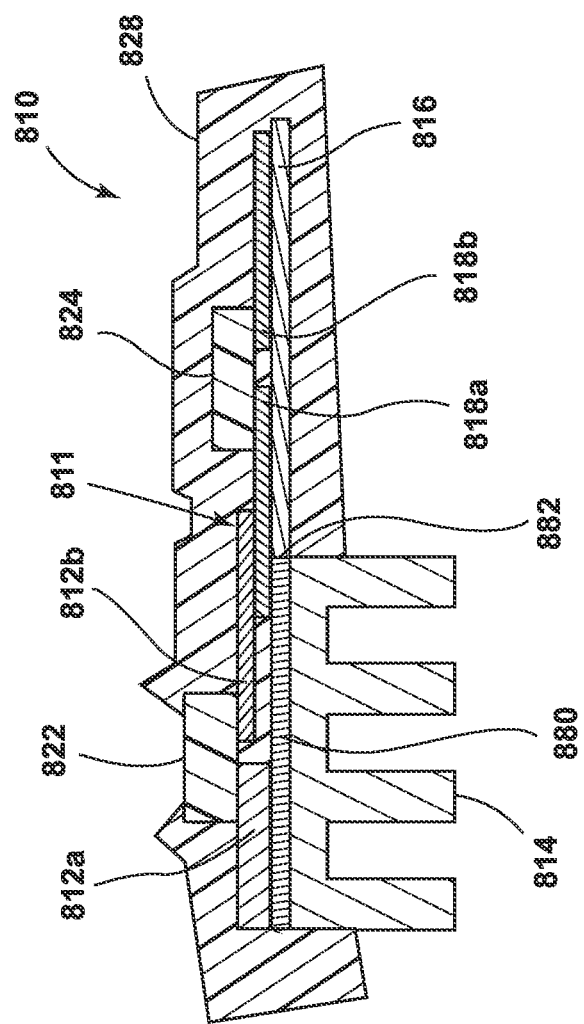
FIG. 11 is a cross-sectional view of a portion of an illumination assembly according to another embodiment of the invention.

In yet another example, the lighting assembly can include both a thermal interface layer and a polymeric substrate layer. FIG. 11 illustrates another example of a lighting assembly 810 that is similar to the lighting assembly 410 of FIG. 7 and 710 of FIG. 10 except for differences in the electrical circuit, heat spreader, thermal interface layer, and the first polymeric layer. Elements of the lighting assembly 810 similar to those of the lighting assemblies 410 and 710 are labeled with the prefix 800. FIG. 11 illustrates a portion of the lighting assembly 810 that includes a single LED; however, the lighting assembly 810 can be part of a more complex lighting assembly that includes a larger electrical circuit and multiple components, such as that shown in FIG. 1 or FIG. 5, for example.

In the embodiment of FIG. 11, the polymeric substrate 816 can include an opening 882 adjacent the heat spreader 814 and the LED 822 in the assembled lighting assembly 810. The thermal interface layer 880 can be provided within the opening 882 to thermally couple the LED 822 and the heat spreader 814. In this example, the polymeric substrate 816 can provide structural support for the electrical circuit 811 in a manner similar to that described above for previous embodiments while the thermal interface layer 880 facilitates heat transfer between the LED 822 and the heat spreader 814.

It will be understood that it is within the scope of the invention that any of the lighting assemblies 10, 210, 310, 410, and 510 described herein can be made in a single-shot molding process without a separate polymeric substrate and including a thermal interface layer for thermally coupling the heat spreader and the electrical component in a manner similar to that described above for the lighting assembly 710 of FIG. 10. In addition, it will also be understood that it is within the scope of the invention that any of the lighting assemblies 10, 210, 310, 410, and 510 described herein can include a polymeric substrate made according to a multiple-shot molding process, in addition to a thermal interface layer for thermally coupling the heat spreader and the electrical component in a manner similar to that described above for the lighting assembly 810 of FIG. 11.

In addition, while the embodiments of the lighting assemblies 10, 210, 310, 410, 510, 610, 710, and 810 are primarily described in the context of thermally coupling a heat spreader with an LED, it will be understood that a heat spreader can be coupled with any exemplary electrical component other than an LED in a similar manner without deviating from the scope of the invention.

IV. Conclusion

The lighting assemblies described herein can address several challenges related to solid-state lighting applications using LEDs. For example, the lighting assemblies described herein integrate the electrical circuit with a polymeric substrate that can be formed or molded into a desired three-dimensional shape. The heat spreader can also be integrated into the lighting assembly by embedding the heat spreader within the polymeric substrate and/or molding the first polymeric layer around the heat spreader. Integration of the electrical circuit and/or the heat spreader can also decrease labor and manufacturing costs compared to designs which utilize multiple separate components and sub-components. In addition, integrating the electrical circuit and/or the heat spreader into the polymeric substrate or the first polymeric layer that can be formed or molded into complex and three-dimensional shapes increases the ability to satisfy end use applications requiring complex form factors.

The ability to place LEDs in different planes can be used to aim light in a desired direction, which can increase efficiency of the end use device. For example, a ceiling light that produces an isotropic radiation pattern of light tends to create a hot spot of light directly below it. The light bulb in the ceiling light can be replaced with the lighting assembly as described herein which includes multiple LEDs aimed so as to generate a non-isotropic radiation pattern that can create a more uniform distribution of light across the floor. The more uniformly distributed light may appear brighter to the viewer, even if the total light output from the ceiling light is the same. The ability to control light patterns could be leveraged to produce lighting products that meet performance specifications while requiring less light, and thus less power.

A traditional lighting assembly typically includes a printed circuit board and would require multiple boards and circuit jumpers in order to achieve multi-directional lighting where the electronics conform to the form factor of the end use device. Such a device would be limited in terms of the size and complexity of the multi-dimensional shape of the lighting assembly. Printed conductors can be used in order to achieve a circuit that can better conform to the contour of the end use device. However, printed conductors can only deliver a small amount of electrical power and dissipate a small amount of heat energy and thus a construction that includes only printed conductors is generally not able to sustain the power levels necessary for achieving general lighting functionality. Providing the circuit with a sheet metal only construction can improve the form factor and power handling capacity compared to a device that uses only printed conductors; however the traces are generally too big to support the electronics necessary to achieve the advanced electronic functionality required in more complex lighting designs.

The lighting assemblies described herein utilize conductors supported by the polymeric substrate in a combination of different ways, such as printing and embedding, in order to provide a circuit that satisfies the electrical current needs of the components as well as component density needs. The combination of more traditional types of conductors with printed conductors can save on materials costs by only utilizing the printed conductors where needed.

The number, size, and location of the heat spreaders can also be customized based on the design of the lighting assembly. Utilizing heat spreaders only where needed can save on materials and manufacturing costs, as well as facilitate satisfying complex three-dimensional form factor requirements. The use of heat spreaders with the polymeric substrate and the supported conductors can improve heat management of the assembly, thus allowing more complex and higher current lighting designs.

The above description is that of current embodiments of the invention. Various alterations and changes can be made without departing from the spirit and broader aspects of the invention as defined in the appended claims, which are to be interpreted in accordance with the principles of patent law including the doctrine of equivalents. To the extent not already described, the different features and structures of the various embodiments of the illumination assemblies 10, 210, 310, 410, 510, 610, 710, and 810 may be used in combination with each other as desired. That one feature may not be illustrated in all of the embodiments is not meant to be construed that it cannot be, but is done for brevity of description. Thus, the various features of the different embodiments of the illumination assemblies 10, 210, 310, 410, 510, 610, 710, and 810 may be mixed and matched as desired to form new embodiments, whether or not the new embodiments are expressly disclosed.

This disclosure should not be interpreted as an exhaustive description of all embodiments of the invention or to limit the scope of the claims to the specific elements illustrated or described in connection with these embodiments. For example, and without limitation, any individual element of the described invention may be replaced by one or more alternative elements that provide substantially similar functionality or otherwise provide adequate operation. This includes, for example, presently known alternative elements, such as those that might be currently known to one skilled in the art, and alternative elements that may be developed in the future, such as those that one skilled in the art might, upon development, recognize as an alternative.

The invention is not limited to the details of operation or to the details of construction and the arrangement of the components set forth in the above description or illustrated in the drawings. The invention may be implemented in various other embodiments and practiced or carried out in alternative ways not expressly disclosed herein.

The phraseology and terminology used herein are for the purpose of description and should not be regarded as limiting. The use of "including" and "comprising" and variations thereof is meant to encompass the items listed thereafter and equivalents thereof as well as additional items and equivalents thereof. Further, enumeration may be used in the description of various embodiments. Unless otherwise expressly stated, the use of enumeration should not be construed as limiting the invention to any specific order or number of components. Nor should the use of enumeration be construed as excluding from the scope of the invention any additional steps or components that might be combined with or into the enumerated steps or components.

The disclosed embodiment includes a plurality of features that are described in concert and that might cooperatively provide a collection of benefits. The present invention is not limited to only those embodiments that include all of these features or that provide all of the stated benefits.

Any reference to claim elements in the singular, for example, using the articles "a," "an," "the" or "said," is not to be construed as limiting the element to the singular.

Directional terms, such as "front," "back," "vertical," "horizontal," "top," "bottom," "upper," "lower," "inner," "inwardly," "outer" and "outwardly," are used to assist in describing the invention based on the orientation of the embodiments shown in the illustrations. The use of directional terms should not be interpreted to limit the invention to any specific orientation.

The invention claimed is:

1. An illumination assembly comprising:
   a layer of an electrically-insulating, thermal interface material having first and second sides;
   an electrical circuit including two conductors in direct contact with the first side of the layer of the thermal interface material;
   a solid state light source electrically coupled to the electrical circuit, the electrical circuit being between the thermal interface material and the light source;
   a heat spreader in direct contact with the second side of the layer of the thermal interface material, the thermal interface material thermally coupling the light source and the heat spreader, such that the conductors of the electrical circuit provide at least a portion of a thermally conductive path from the light source to the heat spreader through the thermal interface material; and
   a polymeric material at least partially around the electrical circuit, the light source and the heat spreader to secure these elements together, the electrical circuit being at least one of printed on the thermal interface material and embedded within the polymeric material.

2. The illumination assembly of claim 1 wherein the thermal interface material comprises one or more of ceramic-impregnated epoxies, ceramic-impregnated silicones, graphene, carbon nanotubes, nano-glue, ceramic-coated copper, ceramic-coated aluminum, and oxidized aluminum.

3. The illumination assembly as defined in claim 1 wherein
the solid state light source is on the first side of the thermal interface material.

4. The illumination assembly of claim 1 wherein the polymeric material forms a moisture seal for the solid state light source and the conductors.

* * * * *